United States Patent [19]

Daito

[11] Patent Number: 5,084,904
[45] Date of Patent: Jan. 28, 1992

[54] SIGNAL TRANSMISSION DEVICE

[75] Inventor: Toshiji Daito, Saitama, Japan

[73] Assignee: Pioneer Electronic Corporation, Tokyo, Japan

[21] Appl. No.: 431,064

[22] Filed: Nov. 3, 1989

[30] Foreign Application Priority Data

Nov. 10, 1988 [JP] Japan .................. 63-284397

[51] Int. Cl.⁵ .......................................... H04B 14/06
[52] U.S. Cl. ...................................... 375/27; 341/143
[58] Field of Search ............... 375/122, 26, 34, 27, 375/30, 33; 332/9 R, 106; 341/143, 200, 51, 61; 358/133, 135; 364/724.2

[56] References Cited

U.S. PATENT DOCUMENTS 4,743,967  5/1988  Takenaka et al. .................. 375/27
4,797,902  12/1985  Nishiquchi et al. .................. 375/27

Primary Examiner—Benedict V. Safourek
Assistant Examiner—Tesfaldet Bocure
Attorney, Agent, or Firm—Sughrue, Mion, Zinn, Macpeak & Seas

[57] ABSTRACT

A signal transmission device transmits digital signals consisting of continuous PCM words in blocks. Adaptive and fixed quantization are selectively used depending upon the changes in the input signal.

4 Claims, 5 Drawing Sheets

SIGNAL TRANSMISSION DEVICE

BACKGROUND OF THE INVENTION

1. Technical Field

The present invention relates to a signal transmission device for transmitting a digital signal consisting of continuous words, such as a PCM signal, obtained by digitizing an analog signal by blocking it for a predetermined number of words, and more particularly to a signal transmission device for transmitting a digital signal by obtaining a predicted error for each block and quantizing the predicted error.

2. Background Art

The general construction of a prior art device is shown in FIG. 8. The device consists of a coding processing system 10 on the transmission (or recording) side and a decoding processing system 20 on the reception (or reproducing) side. The input terminal 11 of the coding processing system 10 is supplied with an input signal $x_n$, which, for example, is an audio PCM signal obtained by sampling an analog audio signal at a frequency $f_s$ and subjecting it to quantization and coding. The difference between the true input signal $x_n$ and a predicted value $\widetilde{X}_n$ from a prediction unit 13 is obtained by a subtractor 12. The prediction unit may be, for example, as shown in FIG. 10, a device which consists of two delay units 31 and 32 for delaying input data by one sampling cycle, two multipliers 33 and 34 for multiplying the data delayed by the delay units 31 and 32 by predetermined coefficients K and $K_2$, respectively, and an adder 35 for summing the results of multiplication. The output data of the adder 35 is the predicted value $\widetilde{X}_n$. The difference output $\delta_n$ from subtractor 12 is quantized in an adaptive quantizer 14 into a quantized value $Q_n$ which is transmitted via an output terminal 15 toward the decoding processing system 20, and is supplied to an adaptive inverse quantizer 16. The quantized value $Q_n$ supplied to the adaptive inverse quantizer 16 is added with a quantization error $q_n$ to become an inverse quantized value $\delta'_n$. The inverse quantized value $\delta'_n$ is added with the aforementioned predicted value $\widetilde{X}_n$ in an adder 17, and is supplied to the prediction unit 13 as an input value $\widetilde{X}_n$. A predicted value $X_{n+1}$ output from the prediction unit 13 based on the input value $\widetilde{X}_n$ serves as the predicted value for the next input signal $X_{n+1}$.

In the decoding processing system 20, the quantized value $Q_n$ transmitted from the coding processing system 10 is supplied to an input terminal 21 and is converted to an inverse quantized value $\delta'_n$, in an adaptive inverse quantizer 22 by being added with the quantization error $q_n$, and is further added in adder 23 with the predicted value $\widetilde{X}_n$ from a prediction unit 24. The sum $\widetilde{X}_n$ is used as an input value to the prediction unit 24 and is applied as an output at output terminal 25 as a decoded signal. The decoding processing system 20 has a construction which is the same as the construction of the latter half of the coding processing system 10 (adaptive inverse quantization unit 16, adder 17, and prediction unit 13).

Next, referring to FIG. 9, which shows actual signal values, the operation of a circuit with the above construction will be described.

First, assume that the input value and its predicted value at a point n on the time axis are $X_n$ and $X_n$, respectively, and their difference is called the predicted error $\delta_n$. Namely, $$\delta_n = X_n - \widetilde{X}_n \quad (1)$$

The predicted error $\delta_n$ is input to an adaptive quantizer $Q_n$ and bit-compressed to, for example, a quantized value $Q_n$ with 4 bits ($-8$ to $+7$). By inputting the quantized value $Q_n$ to the adaptive inverse quantizer 16, its output, namely, the inverse quantized value $\delta_n$, represents the sum of the predicted error $\delta_n$ and the quantization error $q_n$. In other words the equation $$\delta_n' = \delta_n + q_n \quad (2)$$

holds true for situations where the output value is greater than the input value (i.e., sample point n+1 in FIG. 9). However, the equation $\delta_n = \delta'_n + q_n$ holds true for situations where the output value is less than the input value (i.e., sample point n). Further, the sum of the inverse quantized value $\delta_n'$ and the aforementioned predicted value $\widetilde{X}_n$ becomes the input value $\widetilde{X}_n$ to the prediction unit 13, namely, $$\widetilde{X}_n = \delta_n' + \widetilde{X}_n \quad (3)$$

On the other hand, the value $X_n$ is the sum of the input value $X_n$ and the quantization error $q_n$ as is clear from FIG. 9. That is, $$\widetilde{X}_n = X_n + q_n \quad (4)$$

Note that the above result can also be obtained from equations (1)–(3).

By constructing the decoding processing system 20 to be the same as the latter half of the coding processing system 10, it becomes possible to derive the input value $\widetilde{X}_n$ in the prediction unit 24 as a decoded signal. Further, the predicted value $\widetilde{X}_{n+1}$ for the time point (n+1) will be given as the output value of the prediction unit 24 based on the input value $\widetilde{X}_n$. Thus it can be seen that the predicted value for any sample time is based on the prior sample value and therefore the size of $\delta_n$ depends partly on the change in sample values from one sample period to the next.

Signal transmission is carried out by the repetition of the above-mentioned operations, and, for example, decoded output values shown by the broken line in FIG. 9 are obtained for input values as shown by the solid line.

The quantization width (range identified by the arrows in FIG. 9) in the adaptive quantizer 14 and adaptive inverse quantizer 16 varies adaptively in response to the magnitude of the absolute value ($|Q_n|$) of the quantized value $Q_n$ for the preceding cycle. 9).

In this case, the quantized value $Q_n$ is obtained by subjecting a difference between the input value $X_n$ and the predicted value $\widetilde{X}_n$ to the quantization, and more particularly, the predicted value $\widetilde{X}_n$ is obtained by averaging the values of $X_{n-1}$ and $X_{n-2}$ after multiplying each by a coefficient. When the quantized value $Q_n$ is small an input $X_n$ newly applied is approximately equal to the average of the previous two inputs $X_{n-1}$ and $X_{n-2}$ that have been applied thereto. In other words, there is no abrupt change in an input signal at the sampling point n. In contrast, in the case of the quantized value Q being large, there is an abrupt change in the input signal at the sampling point n. Accordingly, the quantization width in the following cycle is varied in response to the absolute value ($|Q_n|$) of the quantized value $Q_n$, so that it is possible to detect the variation in the input signal with the small number of bits, 4 bits for example.

In order to realize the above, the adaptive quantizer 14 and the adaptive inverse quantizers 16 and 22 are provided with coefficient multipliers to vary the quantization width in response to the absolute value ($|Q_n|$). A concrete example thereof will be described.

The quantization width (range identified by the arrows in FIG. 9) in the adaptive quantizer 14 and adaptive inverse quantizer 16 varies adaptively in response to the magnitude of the absolute value ($|Q_n|$) of the quantized value $Q_n$ for the preceding cycle. 9).

As an example of the adaptive variation of the quantization, when $Q_n$ is 4 bits, the quantization width at the point (n+1) is obtained by the product of the following constant K and the quantization width at the point (n). Accordingly, it can be varied adaptively.

| Absolute value of $Q_n$ | Constant K |
|---|---|
| 0 | 0.84 |
| 1 | 0.84 |
| 2 | 0.92 |
| 3 | 0.92 |
| 4 | 1.00 |
| 5 | 1.3 |
| 6 | 1.69 |
| 7 | 2.39 |

Because of this, the quantization error $q_n$ varies with the magnitude of the change in signal, and a more faithful transmission signal becomes possible.

In the prior art device described above, the construction is such that as the frequency of the input signal is increased, the difference between the neighboring sample values is large and the predicted error $\delta_n$ and its quantized value $\delta_n'$ becomes correspondingly large, with a result that the quantization step width becomes large and the quantization error $q_n$ becomes correspondingly large. Consequently, the distortion factor of the decoded value $\widetilde{X}_n$ increases.

FIG. 11 depicts the frequency versus distortion characteristic of the signal transmission device.

In contrast to the case of a PCM signal with the same quantization bit number m, where a band in the vicinity of $f_s/2$, ($f_s$ is the sampling frequency)is available, the band width is narrowed down considerably in the present case if the distortion factor is to be equal to or smaller than the distortion factor of the system using constant quantization level m.

Further, in the prior art device there occurs the so-called slope overflow for a sudden change in the input signal. Namely, when a value exceeding the quantization width indicated by the arrows in FIG. 9 is input, the decoded signal (broken line) cannot follow the input signal (solid line) as shown in FIG. 12, and the distortion is increased.

SUMMARY OF THE INVENTION

The present invention has as an object the elimination of the aforementioned drawbacks in the prior art device, and therefore, the provision of a signal transmission device capable of preventing increased distortion and slope overflow in the high frequency band.

In the signal transmission device in accordance with the present invention, a predicted functional form for every block is formed by a predetermined number of words in an input digital signal consisting of consecutive words, a predicted error is derived for each word by evaluating the difference between the functional value for the current cycle and the functional value for the preceding cycle obtained based on the predicted functional form. The predicted error is quantized and transmitted. An input digital signal is used as a common parameter and a plurality of predicted value generating means are provided for generating different predicted value outputs for the respective words by means of the mutually different predicted functional forms. By comparing the magnitude of maximum absolute value of the block for every block in each of the predicted value outputs of the plurality of predicted value generating means, the predicted functional form is selected as the smallest maximum absolute value generated by a predicted generating means for the block as the set predicted functional form.

DETAILED DESCRIPTION OF PREFERRED EMBODIMENT

Figure 1:
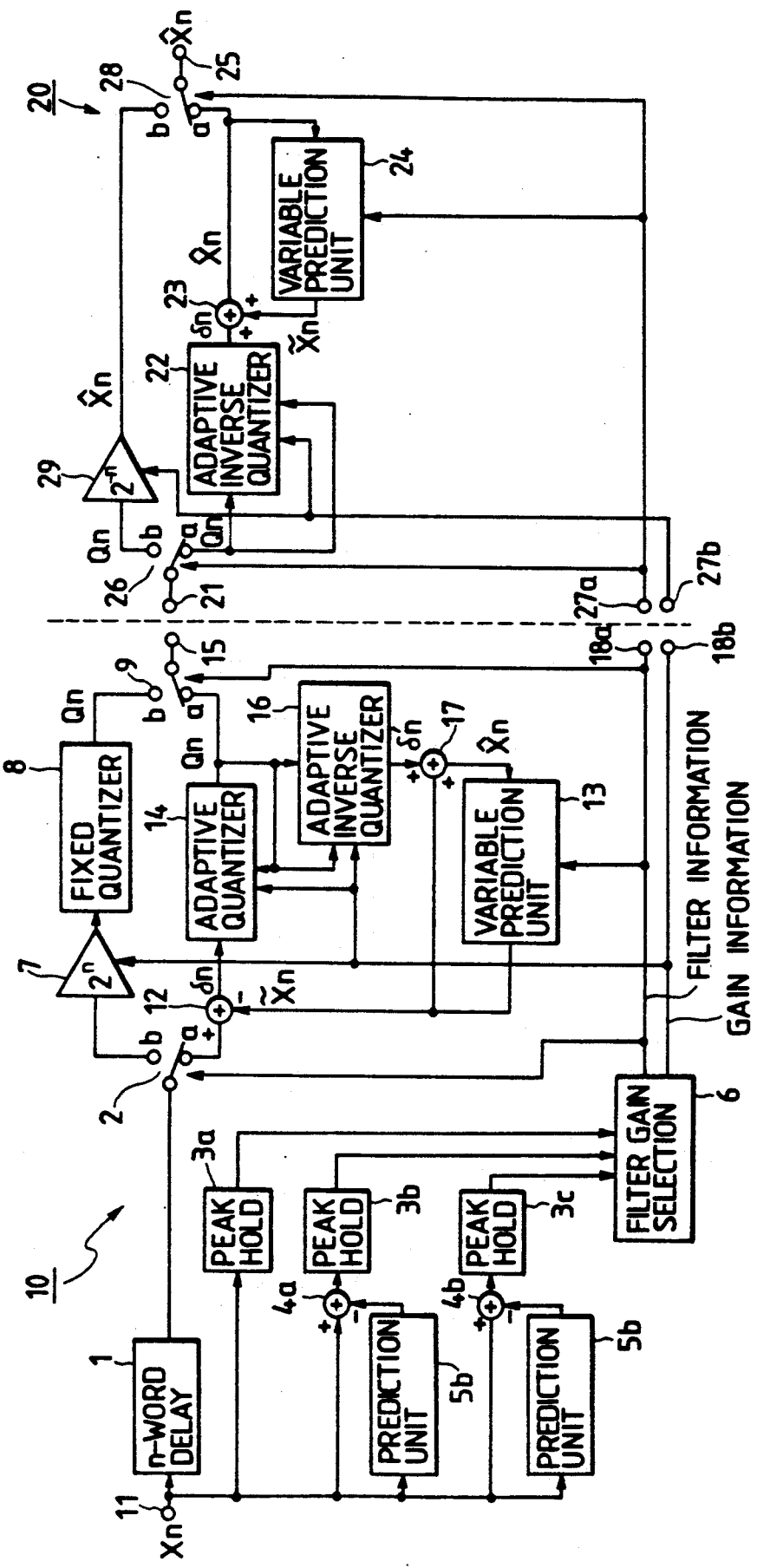
FIG. 1 is a block diagram showing one embodiment of the present invention.
Figure 8:
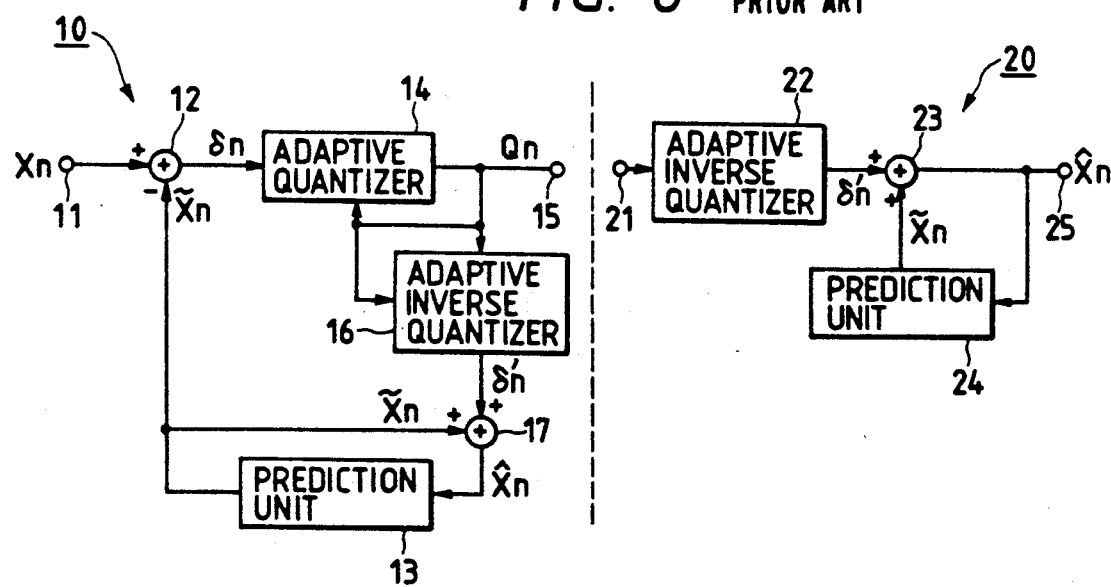
FIG. 8 is a block diagram showing the general construction of a prior art device.

In FIG. 1 which shows a block diagram of an embodiment of the present invention, components identical to those in FIG. 8 are assigned identical symbols. In the FIGURE, an input signal $X_n$ is supplied to a changeover switch 2 after being delayed by a time corresponding to n words in an n-word delay unit 1, and is also supplied directly to a peak holder 3a, adders 4a and 4b, and prediction units 5a and 5b with different predicted coefficients as predicted functional forms. The prediction units 5a and 5b may be the same as the prediction unit 13 described above, but they need not be limited to those only. In the adders 4a and 4b, differences are evaluated between the input value $X_n$ and each of the predicted values of the prediction units 5a and 5b, and these differences are supplied to the peak holders 3b and 3c, respectively. In the peak holders 3a to 3c, peak values within a block of n words are held and each held value is sent to a filter gain selector 6. The input value $X_n$ is supplied directly to the peak holder 3a and that it is equivalent to the case of providing a prediction unit with prediction coefficient of zero.

The changeover switch 2 selects one of two coding processing systems (adaptive D (differential) type PCM processing system and quasi-instantaneous compounding PCM processing system) by being switch-controlled by a filter information output from the filter gain selector 6. Namely, when the changeover switch 2 selects the terminal "a" side, an adaptive DPCM processing similar to the prior case shown in FIG. 8 is carried out by the adder 12, adaptive quantizer 14, adaptive inverse quantizer 16, adder 17 and variable prediction unit 13. Note, however, that in the present embodiment, the predicted coefficient of the variable prediction unit 13 is variable, and the predicted coefficient is switched by filter information from the filter gain selector 6. Further, it is arranged in such a way that the quantization width of the adaptive quantizer 14 and the adaptive inverse quantizer 16 is controlled by gain information from the filter gain selector 6 so as not to fall below a predetermined value. On the other hand, when the changeover switch 2 selects terminal "b" side, the input value $X_n$ is multiplied by $2^n$ based on the gain information from the filter gain selector 6 in a $2^n$-fold multiplier 7, and the value undergoes a quasi-instantaneous compounding PCM processing by which the value is quantized to an m-bit value by a fixed quantizer 8.

The quantized value $Q_n$ quantized by the adaptive quantizer 14 or the fixed quantizer 8 is selected by a changeover switch 9 based on the filter information from the filter gain selector 6, and is transmitted toward the decoding processing system 20 via an output terminal 15. Further, the filter information and the gain information output from the filter gain selector 6 are transmitted via output terminals 18a and 18b toward the decoding processing system 20 as a group of n words. Moreover, the changeover switches 2 and 9 are switched to the terminal "b" side only by the filter information when the filter gain selector 6 selects the output of the peak holder 3a.

On the side of the decoding processing system 20, the quantized value $Q_n$ transmitted from the coding processing system 10 is supplied via an input terminal 21 to a changeover switch 26. With its changeover action controlled by the filter information supplied via an input terminal 27a and sent from the coding processing system 10, the changeover switch 26 selects one of the two systems of decoding processing systems. Namely, when the changeover switch 26 selects the terminal "a" side, an adaptive inverse quantizer 22 and a variable prediction unit 24 having similar construction as the latter half of the coding processing system 10 are operated in response to the gain information and filter information supplied via input terminals 27a and 27b from the coding processing system 10, and the input value of the variable prediction unit 24 is supplied to a changeover switch 28 as a decoded value. When the changeover switch selects the terminal "b" side, the quantized value $Q_n$ is multiplied in a $2^{31}$ $n$-fold amplifier 29 by $2^{-n}$ based on the gain information transmitted from the coding processing system 10 to be supplied to the changeover switch 28. The changeover switch 28 selects either one of the values based on the filter information transmitted from the coding processing system 10, and outputs it from an output terminal 25 as a decoded signal.

Next, the operation of the above circuit will be described.

Figure 2A:
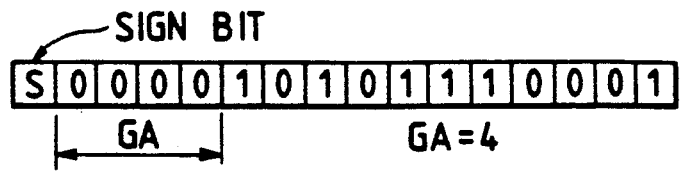
FIG. 2a and 2b are diagrams for explaining the gain information issued by the filter gain selector of FIG. 1.
Figure 2B:
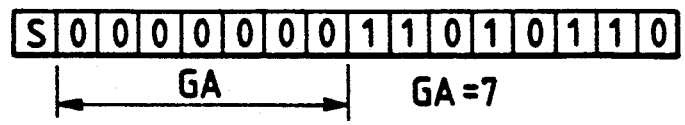

Each input word $X_n$ is applied to peak hold circuit 3a which holds the peak value over a block of n words. Likewise, peak hold circuits 3b and 3c hold peak difference values over the same block of n words, each respective peak difference being generated by the outputs of subtractors 4a and 4b. The filter gain selector 6 selects the predicted coefficient a peak holder which showed the smallest peak-held value as the filter value as having a satisfactory coding efficiency, and determines gain value GA in response to the peak-held value (maximum absolute value). As shown in FIG. 2, the gain value GA is determined by the marginal bit number for the peak held value, and GA=4 in FIG. 2(a) and GA=7 in FIG. 2(b).

Figure 3A:
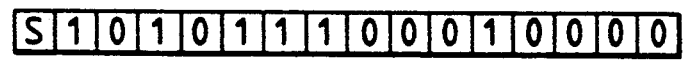
FIGS. 3a, 3b, 4a, 4b, 5a and 5b are diagrams for illustrating the quasi-instantaneous compounding PCM processing.
Figure 3B:
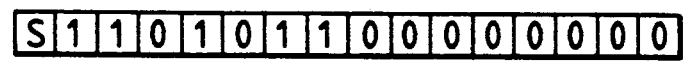
Figure 4A:
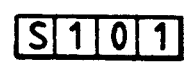
Figure 4B:
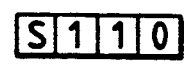
Figure 5A:
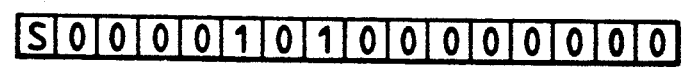
Figure 5B:

On the other hand, during the time when a series of these blocks of n words are processed, the input value $X_n$ is buffered by the n-word delay unit 1. In addition, the changeover switches 2 and 9 are controlled for switching by the filter information from the filter gain selector 6. The time when the filter gain selector 6 selects the peak hold circuit 3a having a predicted coefficient 0, represents that there occurs an abrupt change in the input signal resulting in an occurrence of a difference from the predicted value by the prediction units 5a and 5b. In this case, the switches 2 and 9 are switched to the terminals b, respectively, in response to such,, an output, from the filter gain selector 6 as a filter information. For example, in the case where an input value which is peak-held by the peak holder 3a is minimum, the terminal "b" is selected. In this case, the input value $X_n$ is supplied to the $2^n$-fold amplifier 7 and is multiplied by 2 to the power of GA based on the gain information from the filter gain selector 6. In this way, the values shown in FIGS. 2(a) and 2(b) are shifted to the left by n bits as shown in FIGS. 3(a) and 3(b) and the margin of bits from the peak value becomes zero. Next, such a value is supplied to the fixed quantizer 8 to be rounded to m bits. For example, in the case of m=4, the values shown in FIGS. 3(a) and 3(b) are converted to those in FIGS. 4(a) and 4(b). The rounded value is transmitted to the decoding processing system 20 via the changeover switch 9 and the output terminal 15. The transmitted value is supplied via the input terminal 21 and the changeover switch 26 to the $2^{-n}$-fold amplifier 29, and is multiplied by 2 to the power of -GA based on the gain information from the filter gain selector 6. With this operation, values shown in FIGS. 4(a) and 4(b) go to those shown in FIGS. 5(a) and 5(b), respectively. As in the above, when the mode described in the foregoing is selected, the values shown in FIGS. 2(a) and 2(b) are output eventually as the values shown in FIGS. 5(a) and 5(b), respectively. This is what is generally referred to as the quasi-instantaneous compounding PCM processing technique.

Figure 9:
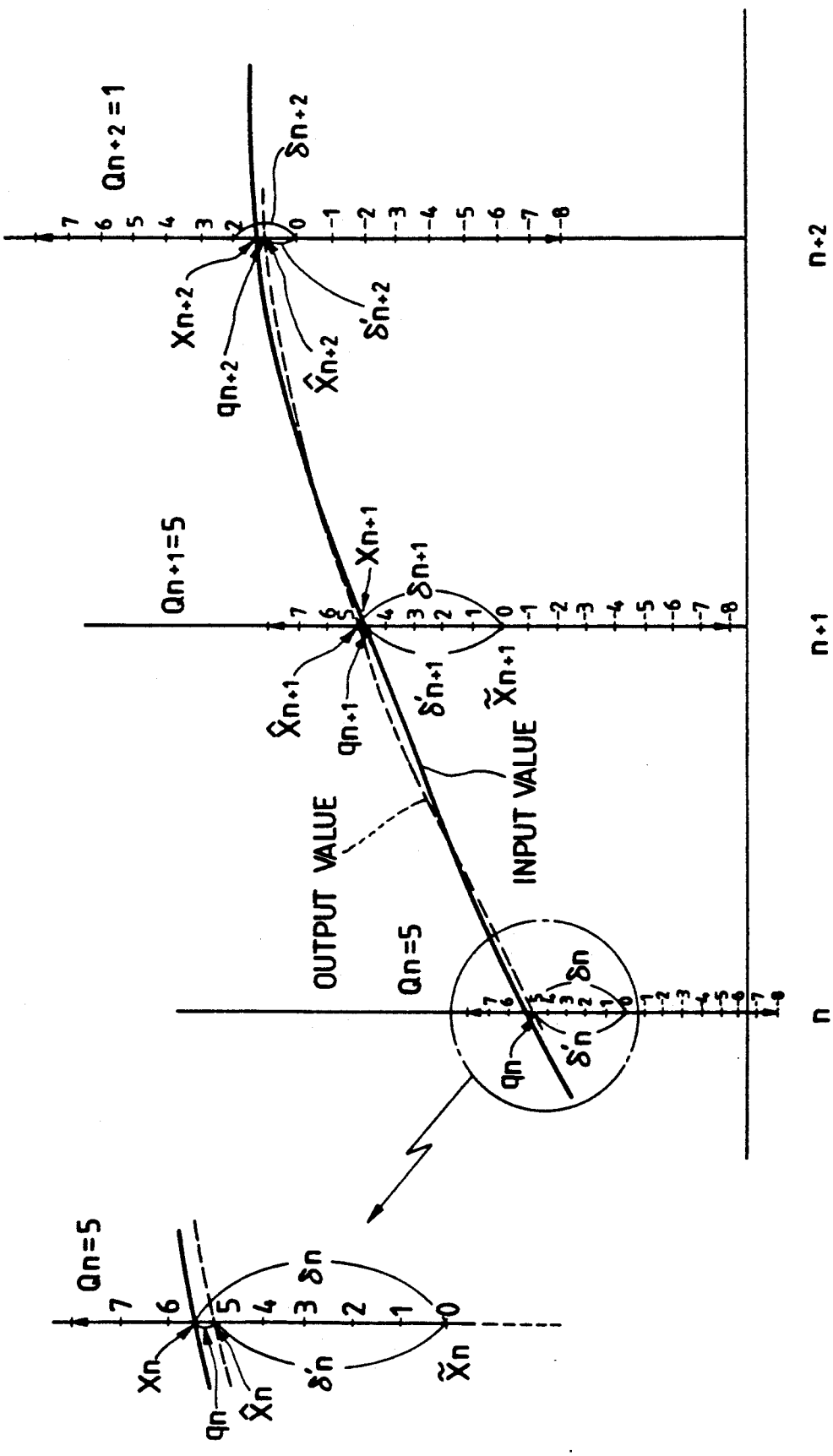
FIG. 9 is a diagram showing the condition of signal changes.
Figure 10:
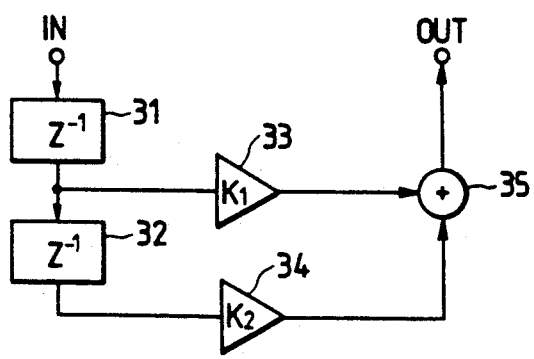
FIG. 10 is a block diagram showing an example of the construction of a prediction unit.

On the other hand, when there is no abrupt change in the input signal $x_n$ and the filter gain selector 6 detects either the output from the peak holder 3b or 3c, the changeover switches 2 and 9 are switched to the terminal "a" side, the general adaptive PCM processing as described in conjunction with the prior art example in FIG. 8 is carried out by means of the adder 12 adaptive quantizer 14, adaptive inverse quantizer 16, adder 17 and variable prediction unit 13. In this case, the variable prediction unit 13 works as a prediction unit with the same predicted coefficient as one of the prediction units 5a and 5b that is selected by the filter information from the filter gain selector 6. Further, the adaptive quantizer 14 and the adaptive inverse quantizer 16 are provided with a limit as to their quantization width (range indicated by the arrows in FIG. 9) by the gain information from the filter gain selector 6, to prevent the width from becoming smaller than a certain value. That is, when the gain information is large, the difference data is thus small, and therefore the limit as to the quantization width can be made small. On the other hand, when the gain information is small, the difference data is relatively large resulting in making the limit larger. The quantized value $Q_n$ thus quantized is transmitted via the changeover switch 9 and the output terminal 15 to the decoding processing system 20. In the decoding processing system 20, decoding of the quantized value $Q_n$ is carried out by the adaptive inverse quantizer 22 and the variable prediction unit 24 having a similar construction as the latter half of the coding processing system 10, and an output value $X_n$ is derived.

The selection of positions a and b of the switches 2, 9, 26 and 28 will now be summarized. The block of input words is sent in parallel to three different prediction units/digital filters in FIG. 1. Each of these prediction units/digital filters has different frequency characteristics due to the fact that different coefficient sets are used in each filter. One filter has a coefficient set which consists of all zero-valued coefficients. This filter provides an output to peak hold circuit 3a which detects the maximum value output from this all zero-valued coefficient filter. The other two filters shown, 5a and 5b, have coefficient sets which are not comprised of all zero-valued coefficients. The outputs of these filters are sent, through summation circuits 4a and 4b, to peak hold circuits 3b and 3c, respectively.

Filter gain selector 6 then detects the minimum value of the three maximum values output from circuits 3a, 3b and 3c. This minimum value represents the filter which has best predicted the digital values in the block of n digital values presently being dealt with.

If the output of peak hold circuit 3a is chosen by the selector 6 as the minimum of the outputs of circuits 3a through 3c, this means that the frequencies between $f_{w2}$ and $f_s/2$ exist in the digital input block and that a fixed quantizer would best reduce the distortion factor (see FIG. 6) for the given digital input block. Thus, the selector 6 sends a control signal on line 18a, so as to cause the switches 2, 9, 26 and 28 to switch to position b so that the fixed quantizer 8 is used, and not the adaptive quantizer arrangement constituted by elements including 14, 16 and 13.

Figure 11:
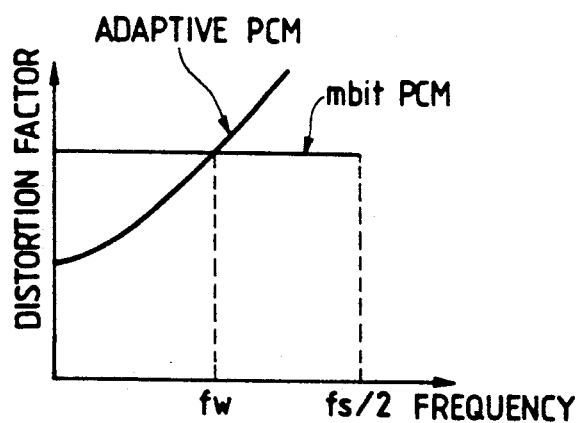
FIG. 11 is a characteristic diagram for signal frequency versus distortion factor according to the prior art.
Figure 12:
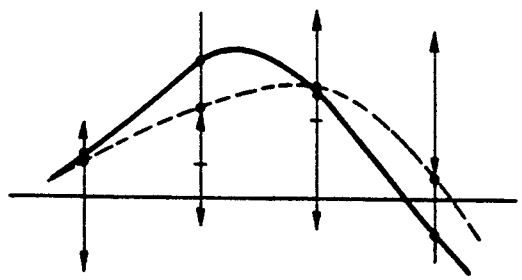
FIG. 12 is a diagram showing the state of slope overflow in the prior art device.

On the other hand, if the output of either peak hold circuit 3b or 3c is chosen by selector 6, this means that frequencies between 0 and $f_{w2}$ exist in the digital input block and that the adaptive quantizer would best reduce the distortion factor (see FIG. 6 and compare with FIG. 11) for the given digital input block. Thus, the selector 6 sends a control signal on line 18a so as to cause the switches 2, 9, 26 and 28 to switch to position a to enable the use of the adaptive quantizer.

Figure 6:
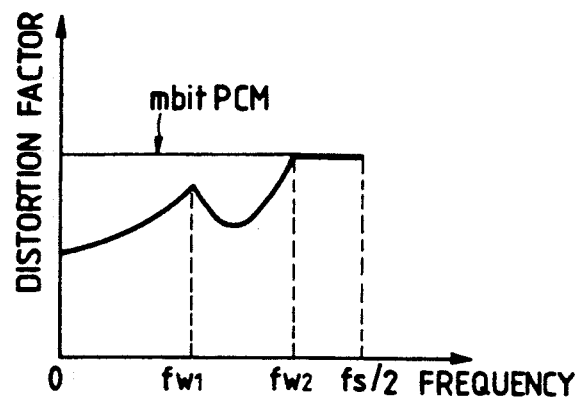
FIG. 6 is a characteristic diagram for signal frequency versus distortion factor in accordance with the present invention.

In this manner, an input digital signal is divided into blocks of n words, and the adaptive DPCM processing or quasi-instantaneous compounding PCM processing is carried out by selecting, from a plurality of prediction units (one of them having zero for all of the coefficients) for the blocks, one with the best coding efficiency. That is, the adaptive DPCM processing is carried out with the prediction unit 5a for the frequency band $0\text{-}f_{w1}$ with the prediction unit 5b for the frequency band $f_{w1}\text{-}f_{w2}$, while the quasi-instantaneous compounding PCM processing is carried out for the frequency band $f_{w2}\text{-}f_s/2$. In this way, the deterioration in the distortion factor in high frequency bands (see FIG. 11) due to the general adaptive DPCM processing can be improved as shown in FIG. 6.

Figure 7:
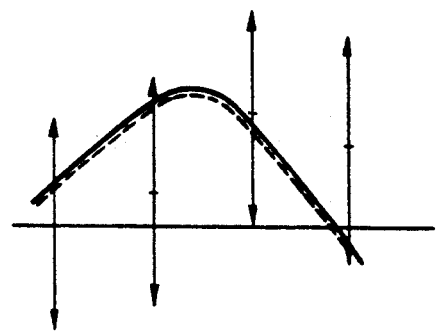
FIG. 7 is a diagram showing the state of preventing the slope overflow by the present invention.

Further, as to the slope overflow, the quantization width can be prevented from becoming smaller than a certain value by the limiter action of the adaptive quantizer 14 and the adaptive inverse quantizers 16 and 22, so that an improvement as indicated in FIG. 7 can be attained.

It is to be noted that in the present embodiment the case of using three prediction units (one of them having zero for all of the coefficient) was illustrated, but there may be provided more of these prediction units. In addition, it was arranged that the filter gain selector 6 selects a prediction unit which displays a minimum peak value. However, it may be arranged to select a prediction unit which shows a minimum of the product of the peak value times the coefficient, namely, the weighted value, instead of the above.

As has been described in the foregoing, the signal transmission device in accordance with the present invention has a construction in which an input digital signal is used as a common parameter, and a plurality of prediction units which generate outputs of predicted values different for each word by means of mutually different predicted functional forms. The magnitude of maximum absolute value for block, out of each output of predicted value of these prediction units, is compared for all blocks to identify the prediction unit having the smallest maximum absolute value for the block. The predicted functional form of the prediction unit thus identified is set in the quantization of the predicted error as the predicted functional form for evaluating the predicted error for signal of every block. As a result, it becomes possible to prevent deterioration of the distortion factor in high frequency band.

Moreover, the quantization width of the quantizer and the inverse quantizer for quantizing the predicted errors are limited not to drop to below a certain value in response to the magnitude of the selected of the maximum absolute value for the block. Therefore, it is also possible to prevent the slope overflow.

What is claimed is:

1. In a signal transmission device for transmitting an input digital signal consisting of consecutive words, each word representing one sample point of the digital signal, by obtaining the difference between a predated value and an actual value as a predicted error for each word and by quantizing the difference, the improvement comprising, in combination:

a delay means for delaying the words from being transmitted until a predetermined number of words has entered the device, said predetermined number of words forming a block;

a plurality of input digital filters used as prediction units each of which has a plurality of coefficients, each of which receives as an input said input digital signal, each of which outputs a predicted value which is subtracted from said input digital signal to provide predicted error signals for each word of said input digital signal, and each of which uses at least one past sample point of said input digital signal in order to calculate a predicted present sample point of said input digital signal;

quantization transmission means for transmitting said predetermined number of words output from said delay means using one of either a fixed quantization means or an adaptive quantization means;

a plurality of peak hold means each for detecting and storing the maximum absolute value of said predicted error signals during a time period corresponding to one block;

selecting means for comparing the maximum absolute values held by said plurality of peak hold means and for selecting the minimum of said maximum absolute values as a quantization means designator signal for designating whether said fixed quantization means or said adaptive quantization means is to be used for signal transmission during said time period corresponding to one block.

2. A signal transmission device as claimed in claim 1, wherein at least one of said plurality of input digital filters has a value of zero for all of said plurality of coefficients.

3. A signal transmission device as claimed in claim 1, wherein said adaptive quantizer means includes an adaptive quantizer and an inverse adaptive quantizer.

4. A signal transmission device as claimed in claim 3 characterized in that a quantization width of said adaptive quantizer and of said inverse adaptive quantizer is controlled in response to said selected minimum of said maximum absolute values held by plurality of peak hold means.

* * * * *